(12) United States Patent
Mutch

(10) Patent No.: US 7,417,943 B2
(45) Date of Patent: Aug. 26, 2008

(54) DYNAMIC COMPRESSION TRAINING METHOD AND APPARATUS

(75) Inventor: Karl N. Mutch, Menlo Park, CA (US)

(73) Assignee: Sonim Technologies, Inc., San Mateo, CA (US)

( * ) Notice: Subject to any disclaimer, the term of this patent is extended or adjusted under 35 U.S.C. 154(b) by 763 days.

(21) Appl. No.: 11/009,899

(22) Filed: Dec. 10, 2004

(65) Prior Publication Data

US 2006/0034212 A1 Feb. 16, 2006

Related U.S. Application Data

(60) Provisional application No. 60/600,521, filed on Aug. 11, 2004.

(51) Int. Cl.
*H04J 3/18* (2006.01)

(52) U.S. Cl. ............... 370/202; 370/351; 370/352; 370/521; 370/522; 375/222; 379/93.31; 379/93.32; 709/247

(58) Field of Classification Search ............ 370/202, 370/351, 352, 521, 522; 375/222; 379/93.31, 379/93.32; 709/247
See application file for complete search history.

(56) References Cited

U.S. PATENT DOCUMENTS

| | | | | |
|---|---|---|---|---|
| 5,852,631 A | * | 12/1998 | Scott | .............. 375/222 |
| 6,693,998 B2 | * | 2/2004 | Olafsson | ............ 379/93.31 |
| 6,839,382 B1 | * | 1/2005 | Davis et al. | .............. 375/222 |
| 7,161,931 B1 | * | 1/2007 | Li et al. | .............. 370/352 |
| 2002/0058501 A1 | | 5/2002 | Hannu et al. | ............ 455/432.2 |
| 2003/0233478 A1 | | 12/2003 | Chuah et al. | .............. 709/247 |
| 2004/0047301 A1 | | 3/2004 | Poikselka et al. | ............ 370/261 |
| 2005/0004972 A1 | | 1/2005 | Meskauskas | ............ 709/200 |

OTHER PUBLICATIONS

International Search Report mailed Jan. 31, 2006 re PCT/US05/27067.
Written Opinion of the ISA mailed Jan. 31, 2006 re PCT/US05/27067.

* cited by examiner

*Primary Examiner*—Philip J Sobutka
(74) *Attorney, Agent, or Firm*—Kali Law Group, P.C.

(57) ABSTRACT

An apparatus for communicating between an access endpoint and a mobile device endpoint comprising a network service center attached to the access endpoint. A memory stores a prototype corpus representing historical communication information. The network service center includes a processor to train the prototype corpus and create a plurality of records including a protocol trigger, training data and a user dictionary. The access endpoint sends the training data to endpoints to produce training data specific to classes of endpoints. The access endpoint and the mobile device endpoint communicate with one another, and the network service center collects communication data related to the communications interaction and stores the communication data in the memory. The processor generates feedback data based at least in part of the communication data. Advantages of the invention include the ability for network operators to optimize communication techniques based on network traffic.

35 Claims, 8 Drawing Sheets

| State Table | |
|---|---|
| State identifier A | State data A |
| State identifier B | State data B |
| State identifier C | State data C |
| State identifier D | State data D |
| State identifier E | State data E |
| ... | ... |
| State identifier N | State data N |

DYNAMIC COMPRESSION TRAINING METHOD AND APPARATUS

RELATED APPLICATIONS

This application claims priority to Prov. No. 60/600,521 filed Aug. 11, 2004, incorporated herein by reference.

FIELD

The present invention relates to dynamic compression training and optimizations, particularly for wireless communication.

BACKGROUND

Conventional techniques are known for compressing information between endpoints in a communication network. For example, the Internet Engineering Task Force provides a Sigcomp (signal compression) open specification for the compression of such information in internet use. These definitions include two specifications. IETF RFC 3320 describes a method for implementing a compression system between endpoints on a data communications network, typically using SIP (Session Initiation Protocol) or any other text based communications. IETF RFC 3321 describes a system for dynamic compression of messages sent using the Sigcomp technique described in RFC 3320. This document describes a dynamic compression technology based upon shared state between two endpoints. These documents can be found on the internet at http://www.ietf.org.

Conventional methods for compression of media, data, and telecommunications traffic using techniques such as Sigcomp rely upon a compressor observing common sequences of information being sent across the communications link over time and use this information to optimize communications also over time. Forcing the communications endpoints to adapt using dynamic compression while the communications link is active is expensive and uneconomic in constrained devices. Restricting adaptation of dynamic compression to 'on-line' scenarios also ignores the potential for optimization using cheaper 'off-line' resources and lost efficiency.

What is needed is an intelligent technique for applying dynamic compression training and optimization, particularly in a wireless communication environment.

SUMMARY

The present invention provides a technique for training a dynamic compressor, and an automated means of creating compressor dictionaries for both constrained and unconstrained communications devices and computing systems. In addition the trainer produces other forms of data and also executable logic that can be used during communications to optimize both speed and efficiency. While the exemplary embodiments are in the field of wireless communications, the invention is applicable to any communications technology.

An exemplary embodiment of the invention is for use in compressing communication between an access endpoint and a mobile device endpoint. The mobile device includes a transceiver, a processor and a memory, wherein the memory is configured to store a mobile state table including a plurality of state identifiers and corresponding state data, and wherein the processor is configured to compress and decompress communication with the access endpoint based at least in part on the contents of the mobile state table. The access endpoint includes a transceiver and coupled to a network services center including a processor and a memory, wherein the memory is configured to store a network state table including a plurality of state identifiers and corresponding data, and wherein the processor is configured to compress and decompress communication with the mobile device based at least in part on the contents of the mobile state table. The access endpoint is configured to selectively transmit updated state identifiers and corresponding state data based on the network state table to the mobile device, and the mobile device is configured to store the updated state identifiers and corresponding state data in the mobile state table. The network services center memory is configured to store a log of communications between the mobile device and the access endpoint. The log of network communications is used to update a corpus of known and observed communications. The communications are also used by the network side dynamic compressor to manipulate states within the compressor.

The benefits of the invention include that a compressor can be trained prior to or shortly after the communications link is established, during communications, or long after communications sessions have ceased. An exemplary embodiment of this is that the compression efficacy can be improved before, or at the same time as, application messages are sent across the link using a dictionary created by an intelligent observer or trainer. The dictionary, having been created by an on-line or off-line trainer, is made available for this purpose. In addition, this method reduces the demands made on devices for the on-line adaptation demanded by dynamic compression. One exemplary aspect of this technique is to allow a communications system to use a combination of scoring incoming messages with trained dictionaries to select appropriately trained dictionaries.

This method also describes a system for a trainer to evaluate large numbers of automatically trained dictionaries to be compared and evaluated against many constraints experienced by specific or generally constrained device types and select those most appropriate for specific devices and conditions.

Advantages of the invention include the ability for network operators to optimize compression techniques based on network traffic. Since different network operators may experience different network traffic, the invention provides a technique to train the compressors for each of the networks based on actual traffic. The result is a custom-tailored set of compression assets, and/or parameters for each network. These and other advantages of the invention are described herein.

DESCRIPTION OF THE DRAWINGS

The foregoing and other features, aspects, and advantages will become more apparent from the following detailed description when read in conjunction with the following drawings.

GLOSSARY

Figure 1A:
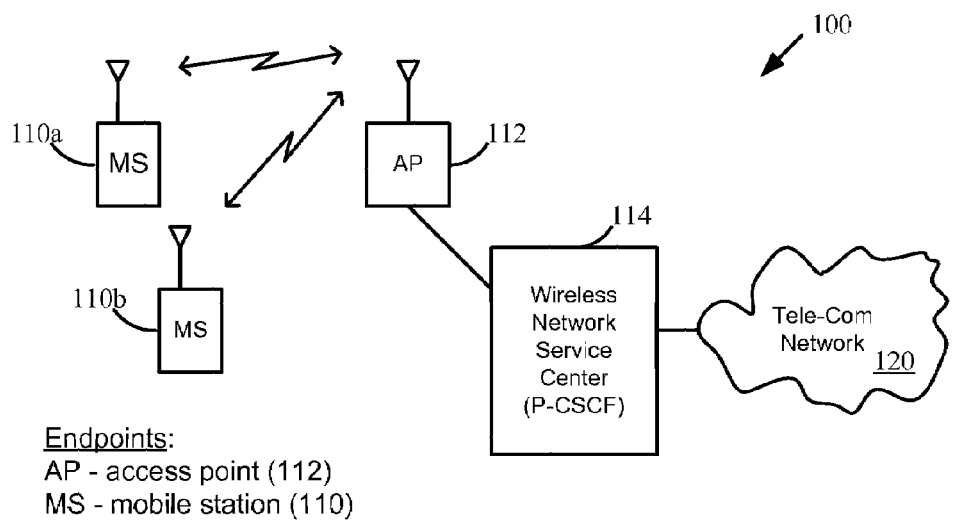
FIGS. 1A-B depict an exemplary physical architecture according to embodiments of the invention.

A glossary is provided for an explanation of the following terminology.

Adaptation—The activity of influencing a compressor to perform Compression using Training Data.

Adaptive Compression—Compression relative to a combination of both Trained, and Dynamic Compression.

Application—An entity that uses a compressor, and decompressor, to perform procedures across a communications infrastructure. Applications are typically under the control of a user who controls their behavior, for example resulting in procedures, also known as transactions, being executed.

Bytecode—Execution logic described using Operation codes (opcodes) and executed either using a virtual machine or a physical computing device.

Bytecode Adaptation—A subset of instructions that can be used to modify an existing set of instructions. Examples of byte code adaptations could include self modifying code.

Bytecode Snippet—A small portion of bytecode that does not constitute a complete bytecode program but which can be combined with other byte code to create a complete bytecode program or bytecode adaptation.

Compressor—Entity that encodes application messages using a certain compression algorithm, and keeps track of state that can be used for compression.

Communications Endpoint—One instance of an application, a compression/decompression layer, and a transport layer for sending and/or receiving messages Communications Path—The logical connection and transport required to create a functioning communications link between endpoints.

Communications Session—The complete exchange of messages between multiple communications endpoints for the entire life of the endpoints and communications path.

Communications System—The system in its entirety of all the entities, interfaces and communications paths described within this method.

Constraint Satisfaction—A method for solving problems in which the goal is to discover values for a set of variables that will optimally satisfy a given set of constraints.

Compression/Decompression Assets—Data including signaling data and messages, byte code adaptations, bytecode snippets, complete bytecode programs, parameters, or dictionaries. In addition other trainer inputs used by either the On-Line or Off-Line trainer entities.

Decompressor—An entity that uses a communications endpoint and receives compressed messages. A decompressor is responsible for decompression of compressed information and then dispatching it to an application layer entity.

Dictionary—A set of values commonly available for compression of communications exchanges used as a concordance.

Dynamic Compression—Compression relative to messages sent prior to the current compressed message.

Executable code—A set of general or specific purpose computer instructions, which are a concrete form of logic expressed in a computer readable format.

Mobile Station—A device capable of acting as a communications endpoint using wireless capabilities as an example of a device endpoint.

Network Operator—The entity responsible for operating the communications infrastructure across which any potential communications sessions might be established.

Network Service Center—The physical infrastructure facing the User Equipment as provisioned by, or provided by a network operator.

Off-line Trainer—A trainer and constraints based entity that seeks optimal solutions to communications and data compression and decompression using computational problem solving for a communications domain using constrains that apply to devices, interfaces, and communications paths found within the domain.

On-line Trainer—A trainer and communications adaptation engine that is capable of executing or running on a device considered as being constrained. Typically the characteristics of devices running as on-line trainers will be described using constraints database.

OTA—Over the Air. A mechanism for sending data and executable code to terminal devices using wireless communications. This mechanism also allows the operator of a wireless network to interact with devices to extract operational data from wireless terminal devices.

Protocol Triggers—A set of criteria for activating events based upon the signaling or data flow of communications between endpoints. Criteria for trigger can include factors such as the syntax or semantic content of messages. Criteria for protocol triggers can also related to application level procedures being used. For example protocol triggers could be used to be activated when an application initiates a person to person Push to talk Over Cellular session with another party. Another example for a Protocol Trigger could be that a presence related message is received updating the presence status of an entity of a contact list in a mobile terminal.

Shared compression—Compression relative to messages received by the local endpoint prior to the current compressed message State Data—Any data transmitted between entities that is used during compression and decompression including bytecode, training data, dictionaries or other data.

Trained Compression—Compression relative to Training Data sent prior to reception of application messages.

Training Data—State Data sent by a communications endpoint which is solely intended to influence, or train, the Dynamic Compression system of a remote endpoint, but which may or may not have useful payload for the application.

Transport—Mechanism for passing data between two endpoints. This method is capable of sending and compressing messages over a wide range of transports including TCP, UDP and SCTP.

Payload—Those portions of messages sent across a communications endpoint that are relevant to an application.

Sigcomp—Signaling Compression. A standard issued by the IETF in the form of a Request For Comment (RFC) document. This standard describes a system for compression of signaling messages sent between endpoints implementing the SIP (Session Initiation Protocol) protocol defined within the standard IETF RFC 3320 and related RFC's.

Training Corpus—A database containing messages sent between communications endpoints during normal application operation.

Trainer—An entity responsible for examining a Training Corpus and computing Training Data.

DETAILED DESCRIPTION

The invention is described with reference to specific apparatus and embodiments. Those skilled in the art will recognize that the description is for illustration and to provide the best mode of practicing the invention. Variations will be apparent to those of skill in the art, for example, while the disclosed embodiments are directed to wireless communication, the invention is applicable to any type communication. Likewise, while reference is made to internet protocol and voice over internet protocol (VoIP), and protocol can be employed consistent with the description of the invention set forth herein.

A. Architecture

FIG. 1A depicts a physical architecture for describing the exemplary embodiments. A number of mobile devices or mobile endpoints, called mobile stations (MS) 110a-110b are in an area serviced by an access endpoint (AP) 112. The access endpoint is connected to a network service center 114 (P-CSCF) that manages the communications with the mobile devices. The service center is also connected to a telecommunications network 120 that provides for global telecommunications access.

Figure 1B:
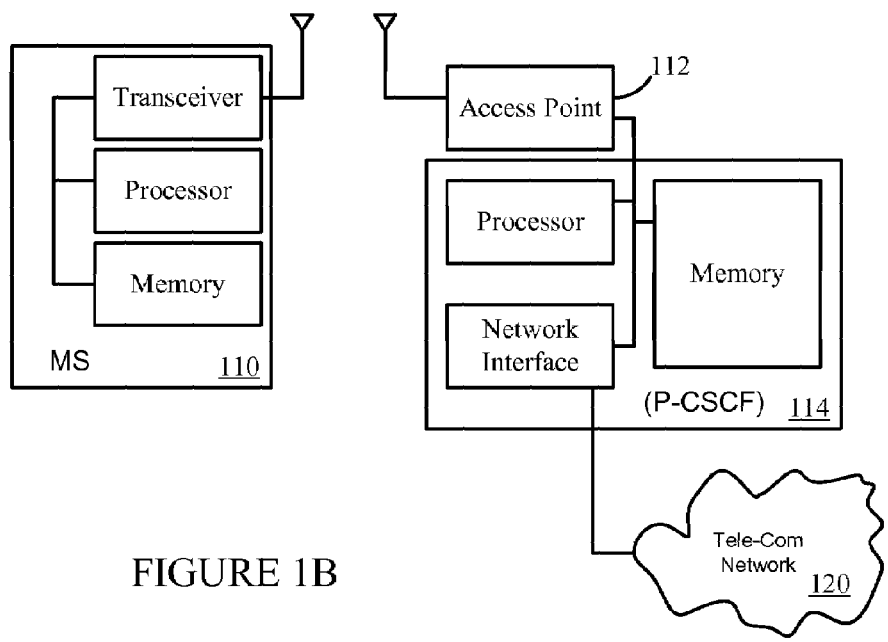

FIG. 1B depicts a block diagram of an exemplary mobile device 110 and network service center 114 (P-CSCF). The mobile devices are often very constrained in terms of processor power and memory. For example, mobile device processors may operate in the range of 26 MHz clock speed and the memories may be in the range of 20 K bytes. This relatively low speed and limited memory space constrains the ability to perform high performance compression/decompression and/or store large compression dictionaries. The mobile device communication link (e.g. wireless link) may also be constrained in terms of the available bandwidth and number of symbols that can be communicated between the endpoints per unit of time. The network service center is not so constrained in terms of processing and memory. In fact, the network service center includes sufficient memory to store a log of the communication for later evaluation, as described below.

Figures 2A, 2B:
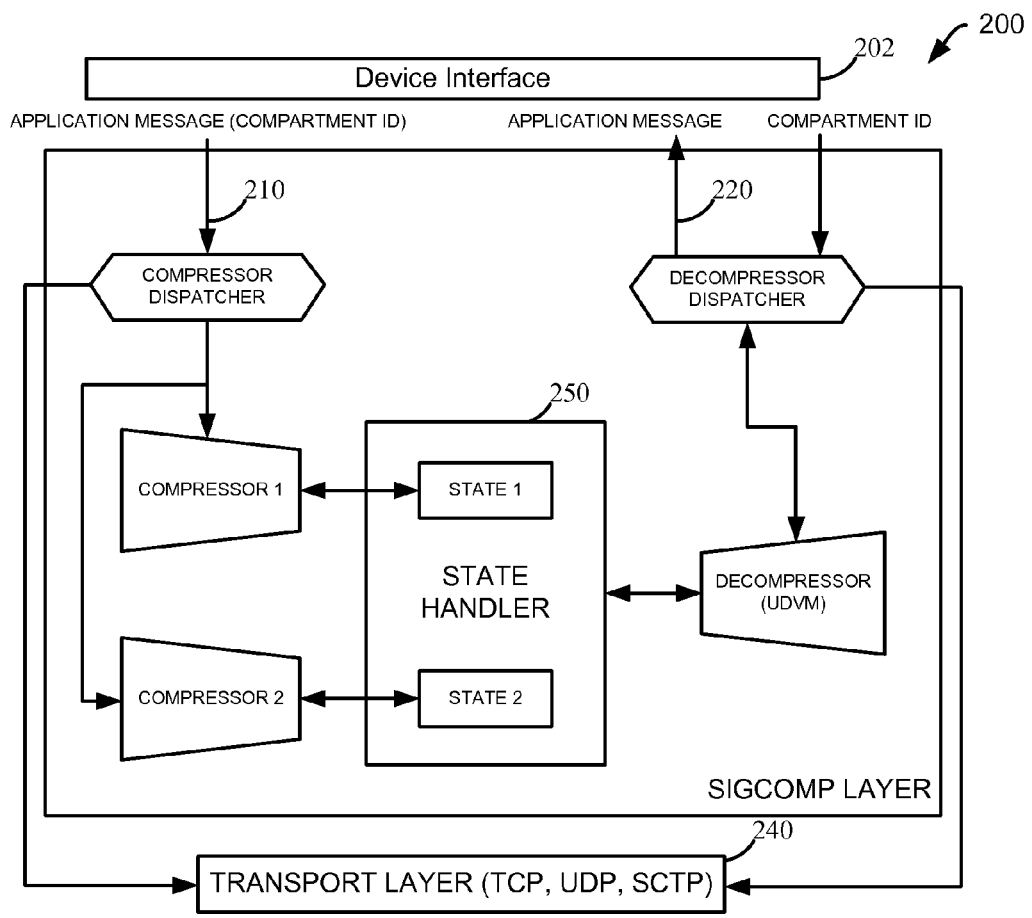
FIGS. 2A-B depict an transport layer signal flow and state table according to embodiments of the invention.

FIGS. 2A-B depict an transport layer signal flow and state table according to embodiments of the invention. The figures depict a message flow 200 where an outbound message from a device interface 202 takes the path 210 that reviews a state table 250 for compression matches, compresses the message and then transports the message via transport layer 240. An inbound message is routed via path 220 that is decompressed and delivered to the device interface 202. In the example of the mobile device, the device interface is the processor, memory and user interface. In the example of the network service center, the device interface is the processor, memory and network interface to the telephone network. In either event, the outbound message and inbound message are both reviewed by the compressor/decompressor, respectively, for matches with a state table 250 since the state table serves as a basis for the compression algorithms. The state table includes a number of state identifiers and corresponding state data. When one of the state data is recognized by the compressor, the corresponding state identifier is substituted for the recognized code. Likewise, when one of the state identifiers is recognized by the decompressor, the corresponding state data is executed to substitute for the recognized identifier. The state data can include code signaling data, dictionaries or other types of data. The state data can also represent a range of options from a series of symbols to bytecode for execution by a processor. In some cases, the bytecode can perform bytecode adaptations, e.g. a self-modifying function that results in new or modified state data.

In the exemplary embodiments, the mobile device is loaded with the state table on initial communications exchanges with the access endpoint, as described below. This permits the state table to be modified and/or completely overwritten by the network service center. In the exemplary embodiments, the state table modifications are based on historical communications and network observations by one or more network operators. The state table may include bytecode, which is typically between 60-500 bytes and modeled as a state within the decompressor. The compressor and decompressor negotiate and share common knowledge such as virtual machine memory sizes, states, and runaway processor protection.

B. Methods of Operation

Figure 3A:
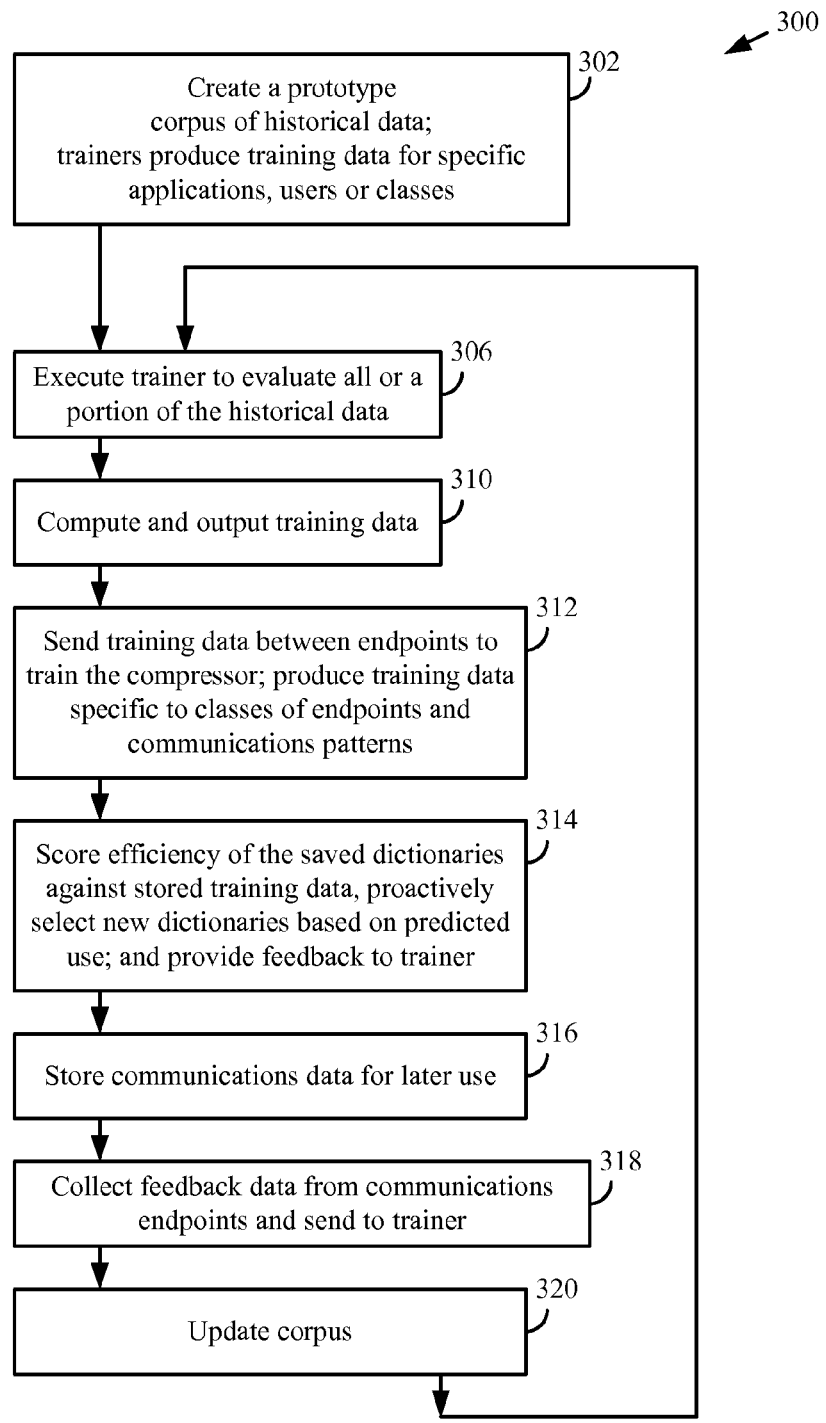
FIGS. 3A-B depict logical information flow including components for improving communications between the endpoints of a wireless network, according to an embodiment of the invention.
Figure 3B:
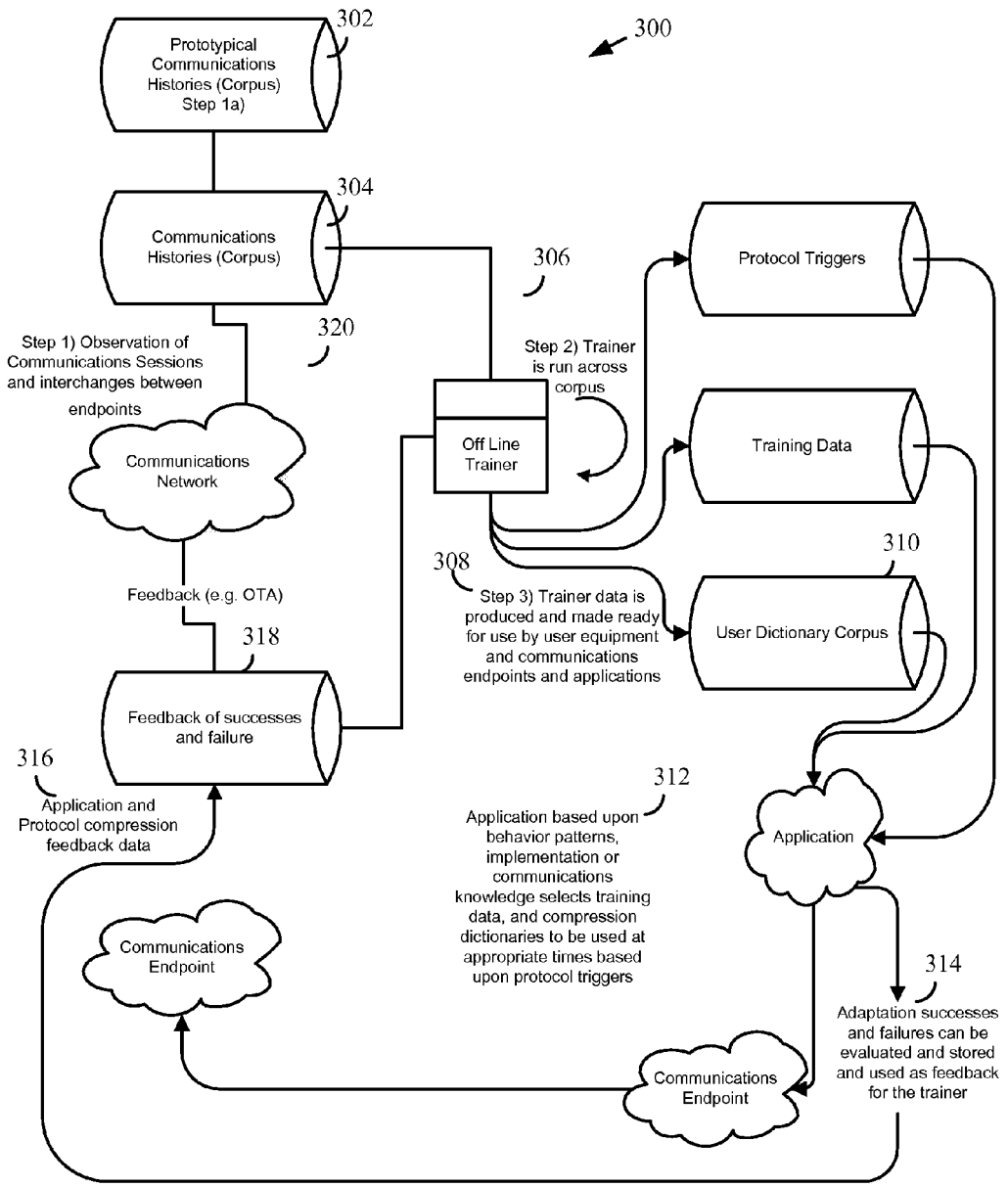

FIGS. 3A-B depict logical information flow including components for improving communications between the endpoints of a wireless network, according to an embodiment of the invention.

This method describes a process whereby communications across endpoints are observed and a corpus of data is collected. Data is collected across multiple communications sessions, or connections, and over a period of time and stored into a database called a Training Corpus. Communications sessions are observed during real world use of the application, or during other relevant types of usage that are relevant for future optimization of the communications interchanges between communications endpoints.

In step 302, when using a trainer for the first time a prototype corpus of simulated or test communications sessions is created by a domain expert, or another third party entity to the communications system being optimized. Trainers evaluate portions of data and are able to automatically produce training data for specific applications using the communications endpoints, or specific users or classes of users using one or many applications. The result is step 306, which represents an initial communications history, or corpus.

In step 306, once a corpus is created a Trainer can be used to evaluate all, or a portion, of the communications session. The trainer computes statistical measures of the occurrences of specific types of information in the corpus in order to generate a compression dictionary of commonly occurring sequences of syntax within the communications protocol. In addition the trainer performs other analysis of the corpus to detect useful compression techniques, or patterns, that it might, or might not be aware of.

In step 310, having evaluated the corpus, the trainer computes and outputs training data. A training sequence can also be run multiple times with different criteria for evaluation of the corpus of data to evaluate different sets or collections of training data. The figures depict a User Dictionary Corpus, which can be a large collection of many user dictionaries. A multitude of dictionaries can exist from which specific dictionaries are chosen.

In step 312, as application endpoints are created the communications system sends training data between endpoints to train the compressor on their respective remote endpoints. This allows trainers to produce training data that is specific to many classes of endpoints, and communications patterns. For example a client endpoint could receive training data from a server endpoint based upon the expected usage patterns of the endpoint being matched with a number of training data sets previously produced by a trainer.

In step 314, once communications begins an endpoint will score the efficiency of the saved dictionaries against training data stored by the trainer and proactively select new dictionaries based upon predicted usage. This acts as feedback to the trainer of the successes and failures experienced by applications and devices using output training data it has produced.

In step 316, as large numbers of communications paths are used in a real-world communications network the network is furnished with entities that are capable of tracing and storing for use by the later new data intended for the historical corpus of communications sessions.

In step 318, feedback data from communications endpoints are then incorporated and sent to the trainer either using communications infrastructure separate and apart from the communications being optimized. Feedback data is then usable by the trainer for subsequent training, and adaptation activities performed by communications endpoints.

In step 320, trainers can then be rerun using the newly updated corpus of history communications sessions to step 314 detect changed usage patterns and create and adapt dictionaries and other types of data and logic that can be leveraged during compression and decompression of media, signaling, and data. These will in turn in re-evaluated and re-scored based by trainer selection and filtering for constrained devices and sent to devices that are known to instantiate endpoints.

Figure 4:
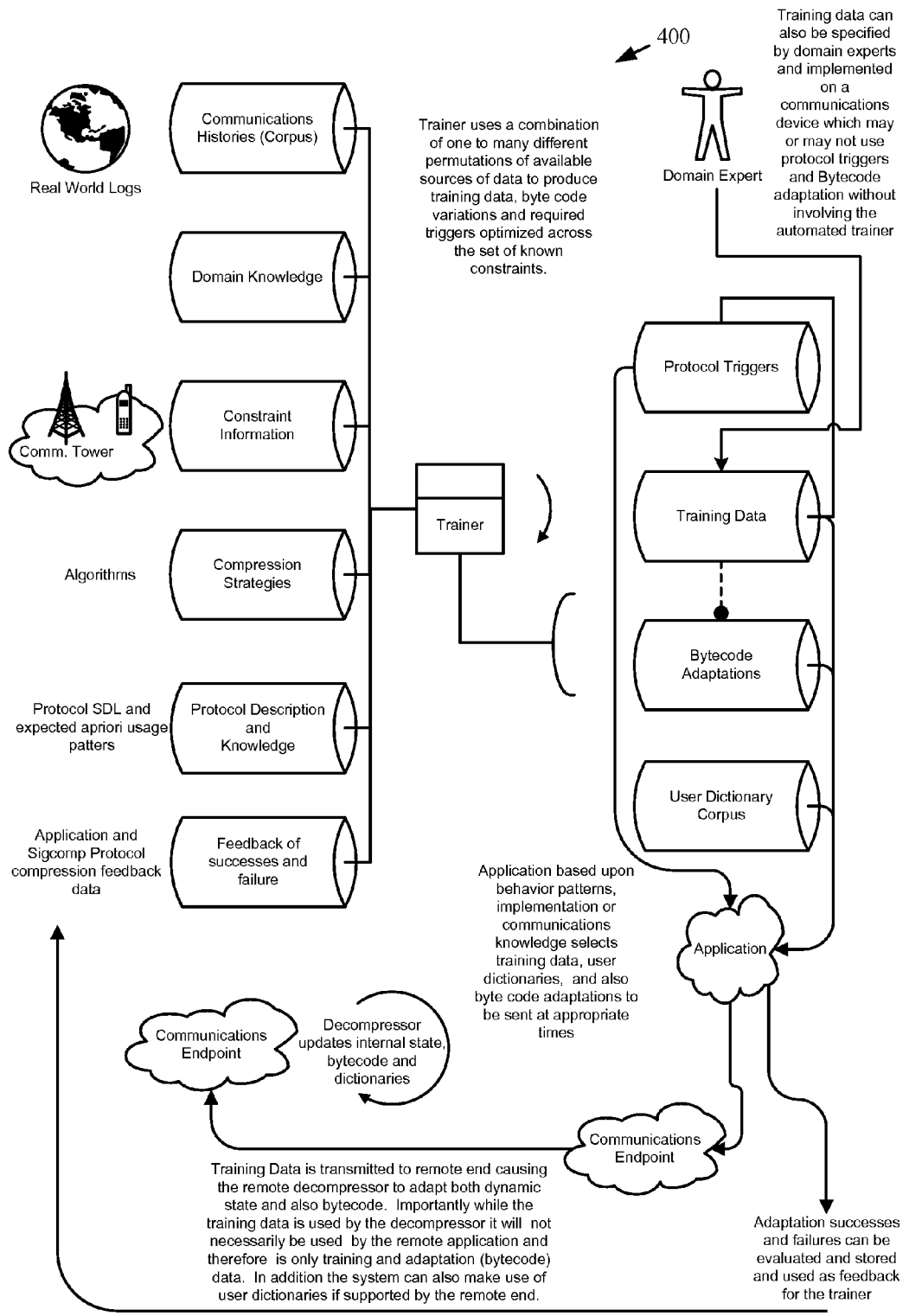
FIG. 4 depicts logical information flow including components for improving communications between the endpoints of a wireless network, according to an embodiment of the invention.

FIG. 4 depicts an advanced method of operation. The advanced method involves the use of one or multiple inputs in conjunction with a manual or automated training system described within the first method. The set of possible inputs to the training method are shown in the above figure with a summary of the steps involved in this method. FIG. 4 adds the aspect of the off-line trainer being able to use additional compression logic and become more selective during training. It can evaluate additional compression algorithms to select existing, or create new compression variants that will each be tested to determine if they improve compression and decompression firstly across the corpus generally and then secondly within the constraints of each device. For example, testing each hypothesis could yield different adaptations for each known constrained device under specific types of application operations. This could also be combined with application or protocol knowledge leveraged by the trainer to create more selective improvements.

Figure 5A:
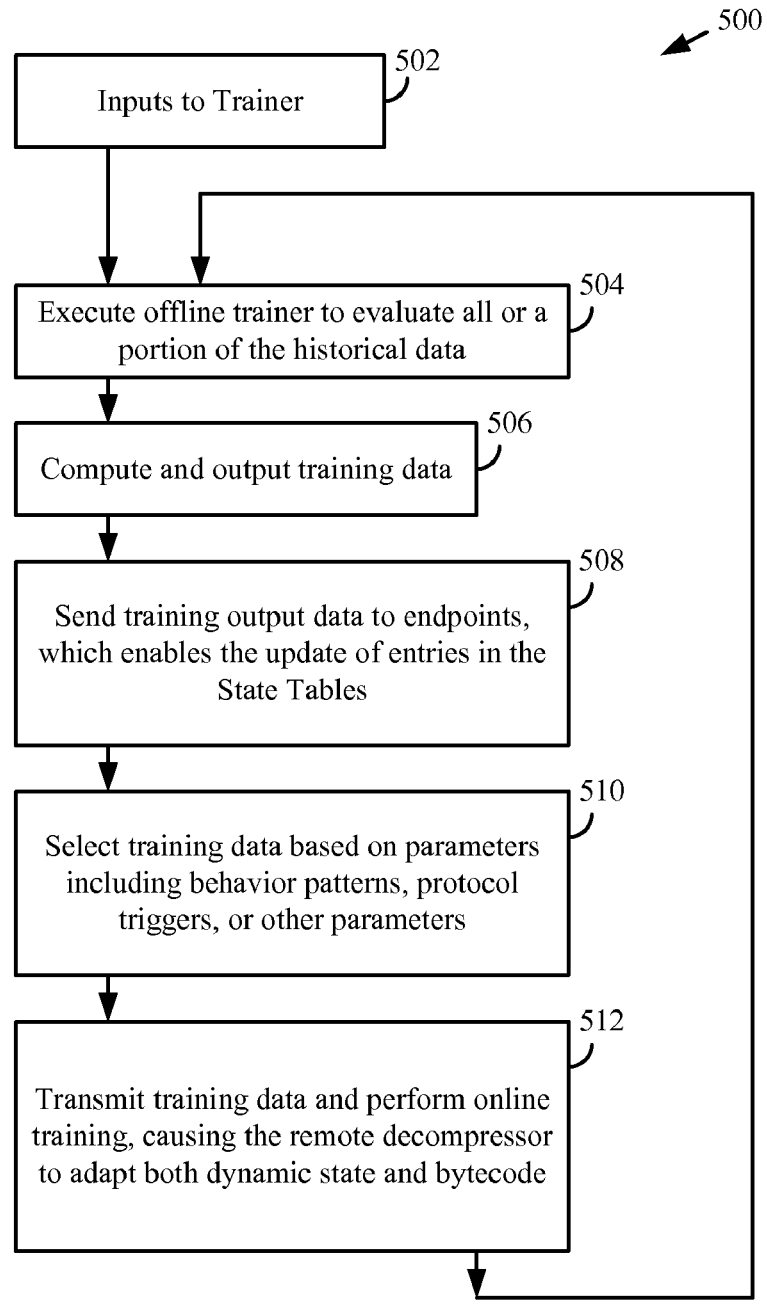
FIGS. 5A-B depict logical information flow including components for improving communications between the endpoints of a wireless network, according to an embodiment of the invention.
Figure 5B:
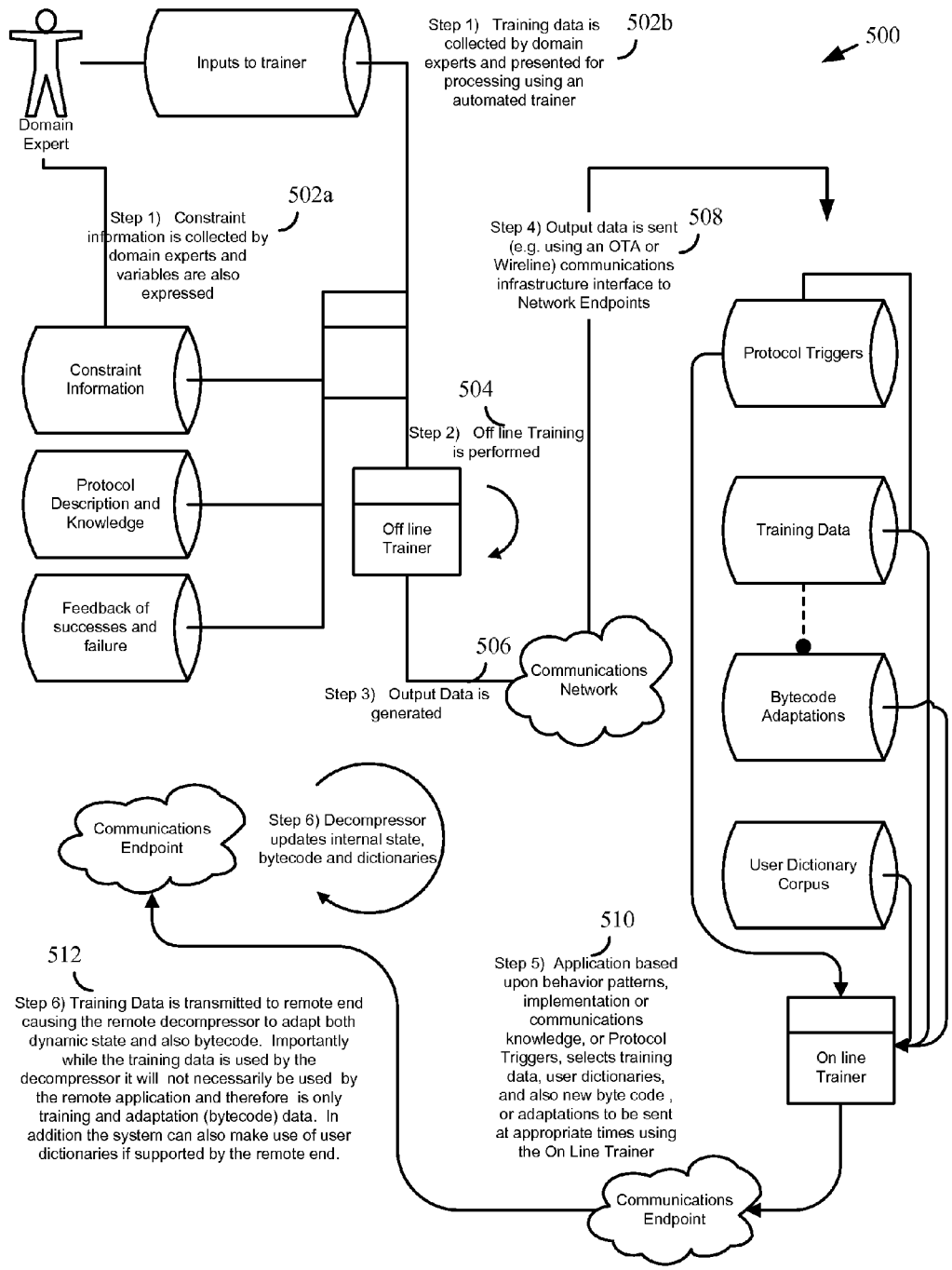

FIGS. 5A-B depict logical information flow including components for improving communications between the endpoints of a wireless network, according to an embodiment of the invention.

In step 502, a domain expert with knowledge of constraints having an influence over the communications efficiency and speed selects inputs for the trainer. The trainer processes these inputs to determine how to best influence or modify the communications path to improve both the efficiency and speed. This is evaluated within any applicable constraints created either any of the communications path, communications endpoints, other parties tightly or loosely associated with the communications path, or other constraints. Domain experts may define constraints within which the trainer can operate to determine and enable solutions or valid values for the variables within the output data produced.

In one option, the trainer accepts as one of its inputs a description of the communications protocol to be employed across the communications path. The trainer uses the protocol descriptions to optimize the compression assets, which improves the likelihood of achieving the trainer's goal of successfully optimizing the communications.

In step 504, the trainer produces one or more outputs that reflect its findings concerning factors that produce optimal efficiency and speed, across constraints that can also act as inputs to the trainer. Constraint parameters and ranges of values for constraining factors affecting compression and decompression speed and efficiency can be automatically generated or derived during training.

In step 506, the trainer acts as a constraint satisfaction system to generate output data, for example dictionaries, execution logic, byte code or other communications based variables that will provide for optimal communications efficiency and speed. The trainer uses both positive and negative constrains to produce optimal data within the output data that can be used to optimize future or ongoing communications interchanges.

The trainer is also responsible for generating compression and decompression dictionaries, or concordances, of commonly occurring communications data sent between communications endpoints as described in the basic operation section. To assist in the automatic generation of dictionaries, the trainer can make use of a corpus of historical or real time real world wireless or wire line communications exchanges. The real world communications corpus acts a history of previous or currently occurring exchanges between one or more communications endpoints. These are used by the trainer to create optimal dictionaries, training data, and/or execution logic used for the constraints under trainer's investigation.

In investigating historical and protocol information for optimal satisfaction of the constraints, the trainer will also be able to make use of execution logic alternatives available within the communications endpoints as input. The trainer will be able to generate adaptations of execution logic that assist in meeting constraints and creating even more optimal communications. To do this the trainer will trade off constraints, for example memory size, execution speed, time of day, expected quality of service, communications bandwidth or throughput, against hypothesized execution logic adaptations or changes created either by the trainer or by a domain expert. Both execution logic adaptations and alternatives may also be evaluated against the history of messages captured from real world communications exchanges.

A trainer has significant flexibility in determining optimization. In addition to historical communications exchanges the trainer can also utilize historical feedback information from the data communications compression and decompression algorithms to guide its evaluation of solutions and its hypothesis's. The trainer in as many permutations as are required can combine each of the trainer inputs. A trainer could require only a single input for example if it was run inside a constrained communications endpoint.

A trainer will be able to output Protocol Triggers using protocol and a-priori knowledge about application procedures. Protocol Triggers are used to classify and denote states in the communications interchanges between endpoints of importance. These triggers are then used during communications interchanges to selectively change the behavior of the compressor or decompressor. For example, triggers can be used by the application to identify messages as they are compressed which should not be used for behavioral changes on the decompressor. This might be used for example by Push to talk Over Cellular to prevent excessive numbers of presence based communications from over writing state on the decompressor side. The protocol trigger could be activated after more than one consecutive presence message is seen to prevent further messages from being used during shared, or dynamic compression state updates.

In step 508, the output trainer data is then sent to communications endpoints using either a wireless over the air (OTA) based infrastructure of a wire line infrastructure. This enables the update of actual network entities with new adaptation and training data.

Exemplary trainers described herein fall into two classes: an off-line trainer and an on-line trainer. An off-line trainer can, for example, be used by a wireless network operator to create the data required to optimize communications for the set of known constrained and also unconstrained devices running within their network, as described in steps 502-506. The network operator then transmits the trainer output data across their network to devices and communications endpoints within the network to adapt on a regular basis the network endpoints to changing application usage patterns, for example, the frequency and duration of application user actions such as whether a Push To Talk over Cellular (PoC) user commonly performs single person to person messaging or uses multi-party group voice messaging, communications path quality, or infrastructure changes. From the input data described within this method it can be seen that the adaptation of behaviors and states within the compression system will also be adapting to many other changes in the network as well.

In step 510, the second class of trainer, an on-line trainer, is the class of trainer that could be hosted within a communications device implementing a communications endpoint. This type of trainer can, for example, take a restricted set of inputs, in comparison to an off-line trainer, and produce a set of outputs that might be specific to the device or communications path. An example of an on-line trainer is one running inside a wireless telephony device which uses trainer to produce dictionaries to cause a remote decompressor adapt to messages it is about to send. Another example is where a device is using the on-line trainer to discover communications patterns and conditions while it is operating allow it to adapt to specific network or device conditions.

The selection of data, code adaptations etc could be done on the basis of observing the subscriber activity on the User Interface in a predictive, anticipatory sense. For example, if the user started selecting multiple contacts, the system could initiate an action to select a new dictionary, new code adaptations, or other action in preparation in predictive anticipation of a group call.

In step 512, trainers can be used in an on-line fashion of adapt their decisions to the constraints encountered with the communications infrastructure or other communications endpoint constraints. On-line trainers can make use of a combination of protocol knowledge supplied as an input combined with protocol triggers. Applications for other communications logic will use the triggers to identify relevant optimization opportunities and then select other data output from the off-line trainer to using in changing communications compression, decompression and endpoint related behaviors and state related to compression and decompression or data to optimize communications speed and efficiency. Protocol triggers use a combination of protocol knowledge, domain expertise, and information garnered by the trainer to identify appropriate triggers. Step 512 can be performed either in the network endpoint or in the mobile device.

The trainer produces information that is appropriate for communications endpoint devices to optimize the communications exchanges they or others in their communications path are participating in. Four classes of data are produced that are useful for adapting the communications path, endpoints, and/or communications.

Protocol triggers is data used by the communications endpoint or communications device implementing an endpoint to determine when data produced by the trainer for given sets of constraints are applicable to the communications path.

Training data is produced by the trainer that can be used to train a local, remote or intermediate communications endpoint to produce optimal communications compression and decompression. This data applies specifically to information that is used by the communications path and is data or media that will influence the compression and decompression efficiency and speed.

Bytecode adaptations represents a collection of execution logic and adaptations of externally existing execution logic that can be used by triggers to activate the transmission and local usage of new compression and decompression logic. This allows an on-line trainer to influence compression and decompression implementations using completely new logic or incremental changes to existing logic.

User dictionary corpus represents a collection of useful dictionaries automatically created by the trainer reflecting a potential set of compression/decompression dictionaries that will be useful for optimal communications if used based upon various triggers in the Protocol triggers that applications on devices implementing communications endpoints or intermediate communications devices along the communications path.

Having produced training data originators of communications exchanges can use the output training data to select combinations of single pieces of training information and send this information through the communications link to a remote decompressor.

The act of sending the training output data across the communications path between communications endpoints trains the compressor and decompressor to prepare them for current or new communications exchanges.

Figure 6:
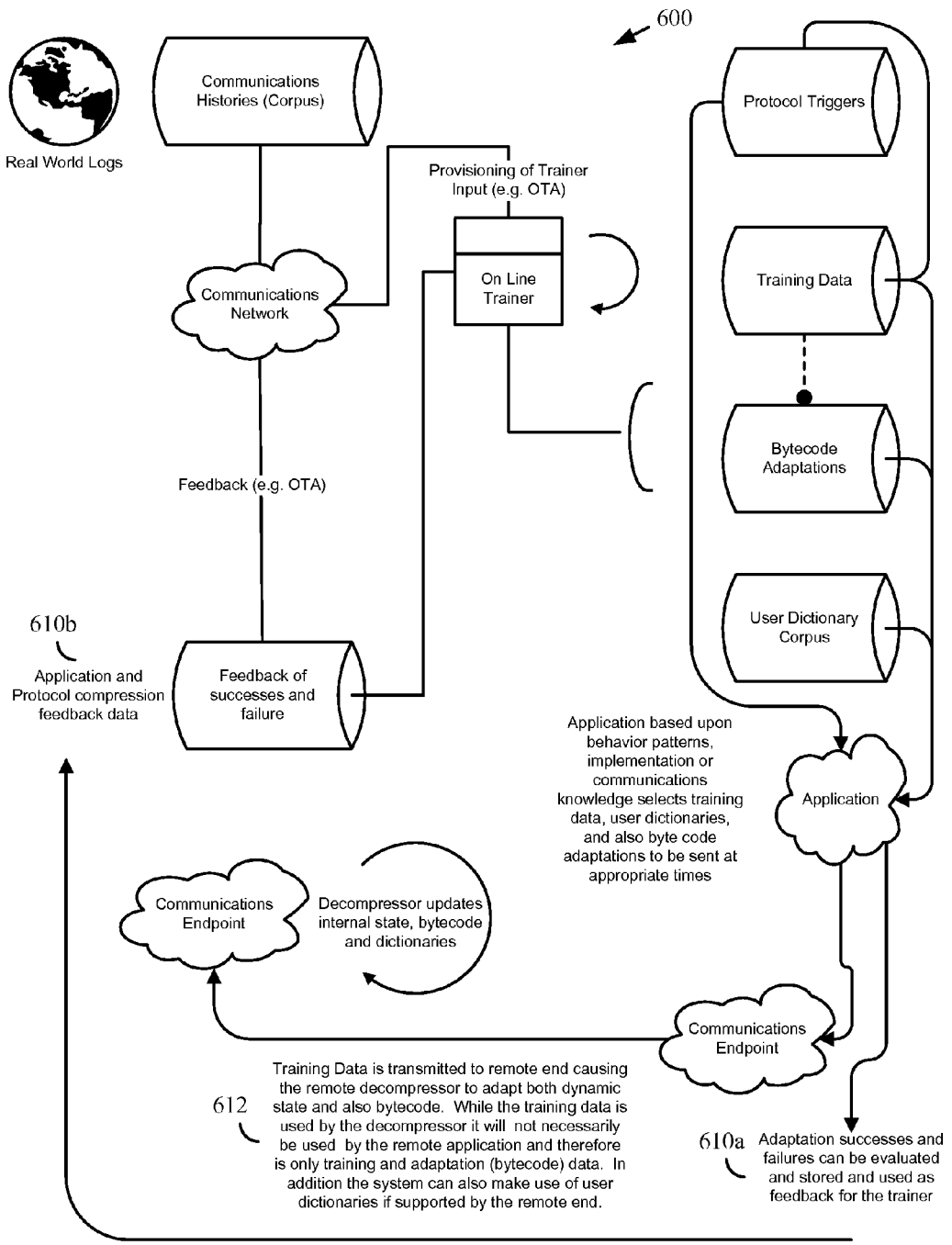
FIG. 6 depicts logical information flow including components for improving communications between the endpoints of a wireless network, according to an embodiment of the invention.

FIG. 6 depicts logical information flow including components for improving communications between the endpoints of a wireless network, according to an embodiment of the invention.

In step 610*a-b*, as the on-line trainer performs compression and decompression related activities, it creates a history of successful attempts and unsuccessful attempts to improve both the speed and efficiency of compression. This collected data is stored and then sent across the operator's network infrastructure to the Off-line trainer in the form of feedback to constraints, adaptations, dictionaries and other assets selected or adapted by the on-line trainer or under the control of the Protocol triggers.

In step 614, this step usually is performed by a network operator or other related entity responsible for observing and maintaining the correct operation of the communications system. In this step the communications network, infrastructure and devices are monitored and input data for the Off-line trainer is collected.

C. Aspects of the Invention

Certain aspects of the invention are described above with reference to the exemplary embodiments. These and additional aspects of the invention are disclosed herein.

Trainer is used to train the Sigcomp states with information that has not previously been seen during a communications exchange and which are useful for compression efficiency and speed improvements in pending or future communications exchanges.

Off-line training of dictionaries. On-line training of dictionaries. Predictive selection of user-dictionaries. Predictive evaluation of user-dictionaries for constrained devices. Iterative retraining of dictionaries of communications patterns and sequences based on real-world usage.

A method that makes use of a corpus of communications traffic, transactions and exchanges recorded over a period of time of communications both within and between network operators networks and communications infrastructure to optimize ongoing and future communications across the same or similar network or infrastructure.

The inventive networks are not limited to wire-line networks but also networks such as wireless, voice, data and converged networks. The collected corpus will be processed to analyze and characterize the actual communications, and entities participating in or parties to communications traffic, transactions and exchanges.

Further a data store will be available for the storage of many variant compression strategies reflected as executable or interpreted code, for example but not limited to byte code or object code. This adaptation store will be used by the trainer to evaluate different compression and communications strategies and characterized for use by the on-line trainer.

The analysis of the communications will result in a number of assets being produced that will be used immediately or at some future point to optimize the communications traffic, transactions and/or exchanges, or communications compression and decompression implementations, or algorithms, improving the characteristics of the operators network, or device implementing network entities.

Further assets created by the trainer will include many compression dictionaries that reflect trainer analysis of recorded communications and optimal strategies for improved compression for the many sets and combinations of constraints commonly experienced within the communications entities and paths used both within and outside of the network operators own network.

With the corpus an additional or combined data store will also be able to record feedback information from the activities of communications entities and paths as they employ communications strategies, optimizations, and dictionaries derived using the corpus to improve future communications traffic, transactions, exchanges, and training operations.

Further the corpus and additional data stores described within this document can be used to evaluate potential new compression and communications strategies in an automated and non-automated scenario to allow those developing new strategies and algorithms to evaluate and validate said strategies and algorithms.

The trainer will also generate variants of the dictionaries, and other generated assets, that reflect individual constraints of entities seeking to employ dictionaries based upon expressed, and derived constraints known to the trainer and stored within the corpus as a result of feedback from devices and entities and also constraints as expressed by network operators.

Further assets created by the trainer can include optimizations of compression algorithms based upon observed inputs and also characteristics of devices or entities seeking to implement compression strategies.

Further an entity implementing a system for analyzing communications and communications entities can utilize information related to, but not limited to, device properties such as available memory and processing speed and throughput and will use these properties as constrains when searching for useful optimizations and adaptations of existing communications assets such as executable, or interpreted code, and data such as, but not limited to, compression dictionaries.

A trainer can generate, or choose, classes of optimizations of communications characteristics, for individual messages, message exchanges between endpoints or across intermediaries, sequences of individual communications exchanges, sequences of messages comprising transactions, that is exchanges commonly occurring across any arbitrary communications path, across sequences of transactions, for the entire life cycle of a communications path, or for all communications occurring within a network operator's network or between networks.

Further an entity implementing an off-line trainer can characterize information produced in the form of assets with information about the characteristics of assets such as but not limited to code optimizations, compression dictionaries and the like, in order that off-line trainers can determine the fitness of the potential code optimizations, or compression dictionaries given the known constraints imposed by the characteristics of the devices implementing communications paths, intermediaries or endpoints currently being optimized.

Assets produced by an the entity implementing analysis and characterization functions, namely the off-line trainer, can be used for optimization and adaptation purposes by entities within the operators network(s) using an on-line trainer.

An on-line trainer can use prediction to determine which optimizations, from the multiple classes and instances of assets, in the form of compression dictionaries or optimized code fragments or entire code implementations of adapted compression and decompression algorithms are candidates for use by network entities implementing endpoints or communications intermediaries to improve communications characteristics.

In addition an on-line trainer can choose appropriate communications messages, or sequences of messages which can be sent by a communications endpoint implementing a compression scheme, for example involving adaptation of the scheme to historical data, to cause the communications compression strategy to utilize information that has either been observed and lost from the compression history, or has yet to be placed into the compression history thereby improving the compression characteristics of messages that either are about to be transmitted or which have been predicted to be sent by the off-line trainer or the on-line trainer.

Further on-line trainers are able to choose from multiple code variations and implementations of compression/decompression algorithms within communications entities implementing communications endpoints or communications intermediaries using as input predicted communications messages, sequences, exchanges or transactions with known constraints for the device and use the most appropriate assets to be for ongoing or future communications interactions based upon satisfying the constraints both local to the device as well as any known or derived constraints for the communications, medium, media, path, intermediaries, remote endpoints, or other entities.

Further a network operator, independently of active communications paths, can upload various optimizations and other assets such as the compression dictionary, to optimize communications characteristics once communications are initiated. Examples of this include Network Operators loading generated or customized compression dictionaries, and either multiple complete code implementations of stock or automatically derived compression and decompression algorithms, implementations, and technology, or many variant code fragments into devices using techniques such as Over the Air Provisioning (OTA).

Having chosen appropriate communications strategy an on-line trainer can be evaluated by the communications device implementing a communications intermediary, endpoint, or communications path can generate feedback information and feed this into the network for collection by the network entity tasked with recording communications related activities and recorded in the corpus for use by trainers either immediately or later in off-line trainer, or general operations, network configuration, and optimization procedures.

D. Conclusion

Advantages of the invention include the ability for network operators to optimize compression techniques based on network traffic. Since different network operators may experience different network traffic, the invention provides a technique to train the compressors for each of the networks based on actual traffic. The result is a custom-tailored set of compression assets for each network. These and other advantages of the invention are described herein.

Having disclosed exemplary embodiments and the best mode, modifications and variations may be made to the disclosed embodiments while remaining within the subject and spirit of the invention as defined by the following claims.

The invention claimed is:

1. A method for communication between an access endpoint and a device endpoint each containing a memory with identifiers and corresponding data, comprising the steps of:
   (a) creating a prototype corpus representing historical communication information;
   (b) training the prototype corpus to create a plurality of records including a protocol trigger, training data and a user dictionary;
   (c) sending the training data to endpoints to produce training data specific to classes of endpoints;
   (d) operating the access endpoint and device endpoint in one or more communications interactions and collecting communication data related to the one or more communications interactions;
   (e) generating feedback data from the operating step; and
   (f) updating the prototype corpus with the feedback data and the one or more communications interactions to create a communications corpus.

2. The method of claim 1, wherein:
the step of creating a prototype corpus includes the step of collecting information from a plurality of endpoints to capture behavior of a communications network.

3. The method of claim 1, further comprising the step of: repeating step (d).

4. The method of claim 1, further comprising the step of: repeating steps (b)-(f).

5. The method of claim 2, further comprising the step of: repeating steps (b)-(f).

6. The method of claim 1, wherein:
the training step uses off-line training of dictionaries.

7. The method of claim 1, wherein:
the training step uses on-line training of dictionaries.

8. The method of claim 1, wherein:
the training step uses predictive selection of user-dictionaries.

9. The method of claim 2, wherein:
the training step uses predictive evaluation of user-dictionaries for constrained devices.

10. The method of claim 1, wherein:
the training step uses iterative retraining of dictionaries of communications patterns and sequences based on real-world usage.

11. The method of claim 1, wherein a network includes both wireline and wireless networks, and wherein:
the step of updating the corpus includes the step of processing the corpus to analyze and characterize the actual communications, and entities participating in or parties to communications traffic, transactions and exchanges.

12. The method of claim 1, further comprising the step of:
storing data in a data store representing variant compression strategies as executable or interpreted code including byte code or object code; and
wherein the data store can be used in the training step to evaluate different compression and communications strategies and characterized for use by the on-line trainer.

13. The method of claim 2, wherein:
the analyzing step includes the step of analyzing the communications between endpoints to develop a number of assets to optimize the communications traffic, transactions and/or exchanges, or communications compression and decompression implementations, or algorithms, improving the characteristics of the operators network, or device implementing network entities.

14. The method of claim 1, wherein:
the training step includes the step of creating assets including compression dictionaries that reflect trainer analysis of recorded communications and optimal strategies for improved compression for the many sets and combinations of constraints commonly experienced within the communications entities and paths used both within and outside of the network operators own network.

15. The method of claim 4, further comprising the step of:
recording feedback information from the activities of communications entities and paths as they employ communications strategies, optimizations, and dictionaries derived using the corpus to improve future communications traffic, transactions, exchanges, and training operations.

16. The method of claim 2, further comprising the step of:
evaluating potential new compression and communications strategies in an automated and non-automated scenario to allow those developing new strategies and algorithms to evaluate and validate the strategies and algorithms.

17. The method of claim 2, wherein:
the training step includes the step of generating variants of the dictionaries, and other generated assets that reflect individual constraints of entities seeking to employ dictionaries based upon expressed, and derived constraints known to the trainer and stored within the corpus as a result of feedback from devices and entities and also constraints as expressed by network operators.

18. The method of claim 4, wherein:
the training step includes the step of creating optimizations of compression algorithms based upon observed inputs and also characteristics of devices or entities seeking to implement compression strategies.

19. The method of claim 4, further comprising the step of:
analyzing communications and communications entities that can utilize information related to, but not limited to, device properties such as available memory and processing speed and throughput and will use these properties as constrains when searching for useful optimizations and adaptations of existing communications assets such as executable, or interpreted code, and data such as, but not limited to, compression dictionaries.

20. The method of claim 1, wherein:
the training step includes the step of generating or choosing from classes of optimizations of communications characteristics, for individual messages, message exchanges between endpoints or across intermediaries, sequences of individual communications exchanges, sequences of messages comprising transactions, that is exchanges commonly occurring across any arbitrary communications path, across sequences of transactions, for the entire life cycle of a communications path, or for all communications occurring within a network operator's network or between networks.

21. The method of claim 6, wherein:
the training step includes the step of implementing an off-line trainer to characterize information produced in the form of assets with information about the characteristics of assets such as but not limited to code optimizations, compression dictionaries and the like, in order that off-line trainers can determine the fitness of the potential code optimizations, or compression dictionaries given the known constraints imposed by the characteristics of the devices implementing communications paths, intermediaries or endpoints currently being optimized.

22. The method of claim 6, wherein:
the training step includes the step of producing assets by implementing analysis and characterization functions, namely the off-line trainer, can be used for optimization and adaptation purposes by entities within the operators network using an on-line trainer.

23. The method of claim 7, wherein:
the training step includes the step of using prediction to determine which optimizations, from the multiple classes and instances of assets, in the form of compression dictionaries or optimized code fragments or entire code implementations of adapted compression and decompression algorithms are candidates for use by network entities implementing endpoints or communications intermediaries to improve communications characteristics.

24. The method of claim 7, wherein:
the training step includes the step of selecting appropriate communications messages, or sequences of messages which can be sent by a communications endpoint implementing a compression scheme, for example involving adaptation of the scheme to historical data, to cause the communications compression strategy to utilize information that has either been observed and lost from the compression history, or has yet to be placed into the compression history thereby improving the compression characteristics of messages that either are about to be transmitted or which have been predicted to be sent by the off-line trainer or the on-line trainer.

25. The method of claim 7, wherein:
the training step includes the step of selecting at least one of multiple code variations and implementations of compression/decompression algorithms within communications entities implementing communications endpoints or communications intermediaries using as input predicted communications messages, sequences, exchanges or transactions with known constraints for the device and use the most appropriate assets to be for ongoing or future communications interactions based upon satisfying the constraints both local to the device as well as any known or derived constraints for the communications, medium, media, path, intermediaries, remote endpoints, or other entities.

26. The method of claim 2, wherein:
the training step includes the step of a network operator, independently of active communications paths, uploading various optimizations and other assets such as the compression dictionary, to optimize communications characteristics once communications are initiated.

27. The method of claim 1, wherein:
the training step includes the step, after selecting an appropriate communications strategy, of evaluating an on-line trainer by the communications device implementing a communications intermediary, endpoint, or communications path can generate feedback information and feed this into the network for collection by the network entity tasked with recording communications related activities and recorded in the corpus for use by trainers either immediately or later in off-line trainer, or general operations, network configuration, and optimization procedures.

28. A method for compressing communication between an access endpoint and a device endpoint each containing a state table with a plurality of state identifiers and corresponding state data, comprising the steps of:
(a) creating a prototype corpus representing historical communication data, transactions and exchanges;
(b) training the prototype corpus to create a plurality of records including a protocol trigger, training data and a user dictionary;
(c) sending the training data to endpoints to train the compressor and to produce training data specific to classes of endpoints and communications patterns;
(d) operating the access endpoint and device endpoint in communications interaction and collecting communication data related to the communications interaction;
(e) generating feedback data from the operating step;
(f) updating the prototype corpus with the feedback data to create a communications corpus.

29. The method of claim 28, further comprising the step of: repeating steps (b)-(f).

30. An apparatus for communicating between an access endpoint and a mobile device endpoint, comprising:
a network service center attached to the access endpoint and including a memory, wherein the memory is configured to store a prototype corpus representing historical communication information;
the network service center including a processor configured to train the prototype corpus and create a plurality of records including a protocol trigger, training data and a user dictionary;
wherein the access endpoint is configured to send the training data to endpoints to produce training data specific to classes of endpoints;
wherein the access endpoint and the mobile device endpoint are configured to communicate with one another, and the network service center is configured to collecting communication data related to the communications interaction and store the communication data in the memory; and
wherein the processor is configured to generate feedback data based at least in part of the communication data.

31. The apparatus of claim 30, wherein:
the access endpoint includes a state table containing state information and state data; and
the mobile device endpoint includes a state table containing state information and state data; and
the endpoint is configured to selectively communicate information from the state table in the access endpoint to the state table in the mobile device endpoint.

32. The apparatus of claim 30, wherein:
the network state table is based at least in part on a trainer reviewing and optimizing the state identifiers and corresponding state data based on historical communication between the mobile device and the access endpoint.

33. The apparatus of claim 31, wherein:
the network state table is based at least in part on a trainer reviewing and optimizing the state identifiers and corresponding state data based on historical communication between the mobile device and the access endpoint.

34. An apparatus for compressing communication between an access endpoint and a mobile device endpoint, comprising:

the mobile device including a transceiver, a processor and a memory, wherein the memory is configured to store a mobile state table including a plurality of state identifiers and corresponding state data, and wherein the processor is configured to compress and decompress communication with the access endpoint based at least in part on the contents of the mobile state table;

the access endpoint including a transceiver and coupled to a network services center including a processor and a memory, wherein the memory is configured to store a network state table including a plurality of state identifiers and corresponding state data, and wherein the processor is configured to compress and decompress communication with the mobile device based at least in part on the contents of the mobile state table; and wherein the access endpoint is configured to selectively transmit updated state identifiers and corresponding state data based on the network state table to the mobile device, and the mobile device is configured to store the updated state identifiers and corresponding state data in the mobile state table;

wherein the network services center memory is configured to store a log of communications between the mobile device and the access endpoint; and wherein the network state table is based at least in part on historical communication between the mobile device and the access endpoint.

35. The apparatus of claim 34, wherein:

the network state table is based at least in part on a trainer reviewing and optimizing the state identifiers and corresponding state data based on historical communication between the mobile device and the access endpoint.

* * * * *